United States Patent
Honda et al.

(10) Patent No.: US 7,112,982 B2
(45) Date of Patent: Sep. 26, 2006

(54) METHOD FOR EVALUATING SEMICONDUCTOR DEVICE

(75) Inventors: Tatsuya Honda, Isehara (JP); Etsuko Asano, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 169 days.

(21) Appl. No.: 10/900,109

(22) Filed: Jul. 28, 2004

(65) Prior Publication Data
US 2005/0024079 A1      Feb. 3, 2005

(30) Foreign Application Priority Data
Jul. 31, 2003    (JP) .............. 2003-283636

(51) Int. Cl.
| | |
|---|---|
| G01R 31/26 | (2006.01) |
| G01R 19/00 | (2006.01) |
| G01R 25/00 | (2006.01) |
| G01R 27/28 | (2006.01) |
| G06F 17/50 | (2006.01) |
| G06F 9/45 | (2006.01) |

(52) U.S. Cl. .............. 324/765; 716/4; 716/5; 702/64; 702/65; 702/117

(58) Field of Classification Search ............ None
See application file for complete search history.

(56) References Cited

U.S. PATENT DOCUMENTS 6,922,643 B1 * 7/2005 Takakamo et al. ............ 702/58

7,019,545 B1 * 3/2006 Kang et al. ................ 324/765

OTHER PUBLICATIONS

E.H. Nicollian and J.R. Brews, "Avalanche Breakdown and Tunneling," MOS (Metal Oxide Semiconductor) Physics and Technology, Wiley-Interscience, 1981, p. 378.

* cited by examiner

*Primary Examiner*—Paresh Patel
*Assistant Examiner*—Roberto Velez
(74) *Attorney, Agent, or Firm*—Eric J. Robinson; Robinson Intellectual Property Law Office, P.C.

(57) ABSTRACT

It is an object of the present invention to provide a method for evaluating a semiconductor device including a semiconductor, an insulator, and a conductor.

The present invention has a first step of applying a voltage to a conductor to measure a current value, a second step of dividing the current value by an area of a region in which a semiconductor is overlapped with the conductor to calculate a current density $J_g$, and a third step of calculating a depletion layer edge leakage current and an in-plane leakage current by using coefficients of a formula $J_g = 2A/r + B$ (A and B are respectively constants) that has a reciprocal of the radius r and the current density $J_g$. Alternatively, the present invention has the first step, the second step, and another third step of using coefficients of a formula $J_g = A/W + B/L + C$ (A, B, and C are respectively constants) that has reciprocals of a channel width W and a channel length L of the semiconductor and the current density $J_g$ to calculate a depletion layer edge leakage current, an in-plane leakage current, and a silicon edge leakage current.

4 Claims, 12 Drawing Sheets

--- applying a voltage to a conductor with a radius r to measure a gate leakage current

↓ dividing the gate leakage current by an area of a region in which a semiconductor is overlapped with the conductor to calculate a current density $J_g$

↓ calculating a depletion layer edge leakage current and an in-plane leakage current by using coefficients of a formula $J_g = 2A/r + B$ (A and B are respectively constants) that has a reciprocal of the radius r and the current density $J_g$ A region where a depletion layer edge leakage current is generated.

A region where a silicon edge leakage current is generated.

METHOD FOR EVALUATING SEMICONDUCTOR DEVICE

BACKGROUND OF THE INVENTION

1. Field of the Invention

The present invention relates to a method for evaluating a semiconductor device that has a MOS (Metal-Oxide-Semiconductor) structure, and particularly, relates to a method for evaluating a semiconductor device, which separates a gate leakage current by leakage path.

2. Description of the Related Art

Recently, a functional circuit using a semiconductor device has been actively developed. In order to realize a highly functional circuit, it is necessary to get a device to work at a high speed in order to realize a highly functional circuit, for which it is necessary that the device should be reduced in size and integrated. However, when a device becomes smaller, a decrease in threshold voltage or punch-through is caused to generate so-called short channel effect which means that a drain current cannot be controlled by a gate voltage. In order to suppress the short channel effect, it is effective to thin a gate insulating film. However, when the gate insulating film is thinned, a gate leakage current is increased to cause failure in operating a circuit.

On the other hand, according to Non-Patent Document 1 (Nicollian and Brews, MOS Physics and Technology, p. 378, FIG. 9.4), in the case of a MOS capacitor that has a small impurity concentration in a substrate, a depletion layer is extended transversely from an edge of a gate electrode. Since the width of an edge portion of the depletion layer is smaller as compared to that of the depletion layer just below the gate electrode, the edge portion of the depletion layer has a larger electric field as compared to the depletion layer just below the gate electrode. In consequence, a gate leakage current from the edge portion of the depletion layer is increased. Therefore, a gate leakage current generated in the MOS capacitor that has the small impurity concentration in the substrate includes an in-plane leakage current that flows from all over in a plane of the electrode and a leakage current from the edge portion of the depletion layer.

In addition, in the case of a field-effect semiconductor device such as a transistor, a leakage current is generated from an edge portion of a semiconductor in a source to drain direction (channel length direction). In this connection, top views of transistors, FIGS. 12A and 12C, and sectional views of the transistors, FIGS. 12B and 12D, are used to simply describe a leakage current from the aforementioned edge portion of the depletion layer and a leakage current from the edge portion of the semiconductor.

A depletion layer edge leakage current corresponds to a leakage current from an edge portion of a depletion layer, which is a current generated in a region surrounded by a dashed line in the top view of the transistor, FIG. 12A, and corresponds to a current that flows in a direction indicated by an arrow in the sectional view of the transistor, FIG. 12B. A silicon edge leakage current corresponds to a leakage current from the edge portion of the semiconductor in the source to drain direction (channel length direction), which is a current generated in a region surrounded by a dashed line in the top view of the transistor, FIG. 12C, and corresponds to a current that flows in a direction indicated by an arrow in the sectional view of the transistor, FIG. 12D. When an insulator is thinned, these regions become thinner as compared the other regions. Therefore, a high electric field is applied to generate a leakage current. The silicon edge leakage current depends on an etched shape of the semiconductor, and is a leakage current generated only in the field-effect transistor.

SUMMARY OF THE INVENTION

As described above, it is known that a leakage current is generated in the plane of the conductor (gate electrode), from the edge portion of the depletion layer, and from the edge portion of the semiconductor. However, it has been impossible to separate a gate leakage current by leakage path quantitatively. Therefore, it has been impossible to respond appropriately for improving a gate insulating film qualitatively.

In view of the actual situation, it is an object of the present invention to a method for evaluating a semiconductor device, which separates a gate leakage current by leakage path. Further, it is also an object of the present invention to feed back appropriately to a process to enable a gate insulating film to be improved qualitatively.

A method for evaluating a semiconductor device according to the present invention includes a first step of applying a voltage to a conductor (gate electrode) with a radius r to measure a gate leakage current, a second step of dividing the gate leakage current by an area of a region in which a semiconductor is overlapped with the conductor to calculate a current density Jg, and a third step of calculating a depletion layer edge leakage current and an in*plane leakage current by using coefficients of a formula Jg=2A/r+B (A and B are respectively constant) that has a reciprocal of the radius r and the current density Jg.

The first step is a step of providing a potential difference between the semiconductor and the conductor, and it is preferable that a potential of the semiconductor is equal to a potential of a lower-potential power supply Vss. The potential of the lower-potential power supply is a ground potential (=0 V) in a lot of cases. In the second step, the area of the region in which the semiconductor is overlapped with the conductor corresponds to an area $\pi r^2$ of the conductor. Accordingly, this value $\pi r^2$ may be used. In the third step, the coefficients correspond to 2A and B. The depletion layer edge leakage current is proportional to 2A, and the in-plane leakage current is proportional to B.

Another method for evaluating a semiconductor device according to the present invention includes a first step of applying a voltage to a conductor to measure a gate leakage current, a second step of dividing the gate leakage current by an area of a region in which a semiconductor is overlapped with the conductor to calculate a current density Jg, and a third step of calculating a depletion layer edge leakage current, an in-plane leakage current, and a silicon edge leakage current by using coefficients of a formula Jg=A/W+B/L+C (A, B, and C are respectively constants) that has reciprocals of a channel width W and a channel length L of the semiconductor and the current density Jg.

The first step is a step of providing a potential difference between the semiconductor and the conductor, and it is preferable that a potential of an impurity region included in the semiconductor is equal to a potential of a lower-potential power supply Vss. In the second step, the area of the region in which the semiconductor is overlapped with the conductor corresponds to a channel formation region included in the semiconductor, and has a region corresponding to an area W×L (W is the channel width and L is the channel length) given by multiplying the channel width by the channel length. Accordingly, this value W×L may be used. In the third step, the coefficients correspond to A, B, and C. The depletion layer edge leakage current is proportional to A, the in-plane leakage current is proportional to B, and the silicon edge leakage current, is proportional to C.

In the present invention, the semiconductor device has a MOS structure (a laminated structure of a semiconductor, an insulator, and a conductor), and corresponds to a device such as a MOS capacitor or a transistor. In addition, as described above, the depletion layer edge leakage current corresponds to a leakage current from an edge portion of a depletion layer, the in-plane leakage current corresponds to a leakage current from a plane of a gate electrode, and the silicon edge leakage current corresponds to a leakage current from an edge portion of a semiconductor in a source to drain direction (channel length direction).

DETAILED DESCRIPTION OF THE INVENTION

Embodiment Mode

An embodiment mode of the present invention will be described with reference to the drawings.

First, as a semiconductor device that has a MOS structure, a case of a MOS capacitor will be described. A leakage current from an edge portion of a conductor is considered to be proportional to a length of a periphery of the conductor. In this connection, when a MOS capacitor including a circular conductor has an electrode radius r and a constant of proportion A, a leakage current $Ig_1$ from an edge portion of the conductor is expressed by $Ig_1=2\pi r \times A$ (Formula 1). In the same way, a leakage current $Ig_2$ from a plane of the conductor is expressed by $Ig_2=\pi r^2 \times B$ (Formula 2). However, in Formulas 1 and 2, the constants of proportion A and B are given by a function of a thickness of a gate insulating film, a voltage applied to the conductor, and a dopant density of a silicon wafer substrate. Accordingly, a gate leakage current $Ig_3$ including both the leakage current from the edge portion of the conductor and the leakage current from the plane of the conductor is given by the sum of Formula 1 and Formula 2, which is expressed by $Ig_3=Ig_1+Ig_2=2\pi r \times A+\pi r^2 \times B$ (Formula 3).

From Formula 3, a current density Jg of the gate leakage current is expressed by $Jg=Ig_3/\pi r^2=2A/r+B$ (Formula 4). Then, from Formula 4, it turns out that the current density Jg is proportional to a reciprocal of the electrode radius r. Accordingly, the leakage current from the edge portion of the conductor and the leakage current from the plane of the conductor can be obtained respectively from a slope (2A) and an intercept (B) of a line given by using Formula 4 to fit the relationship between the current density and the reciprocal of the electrode radius r (a linear equation).

Figure 1A:
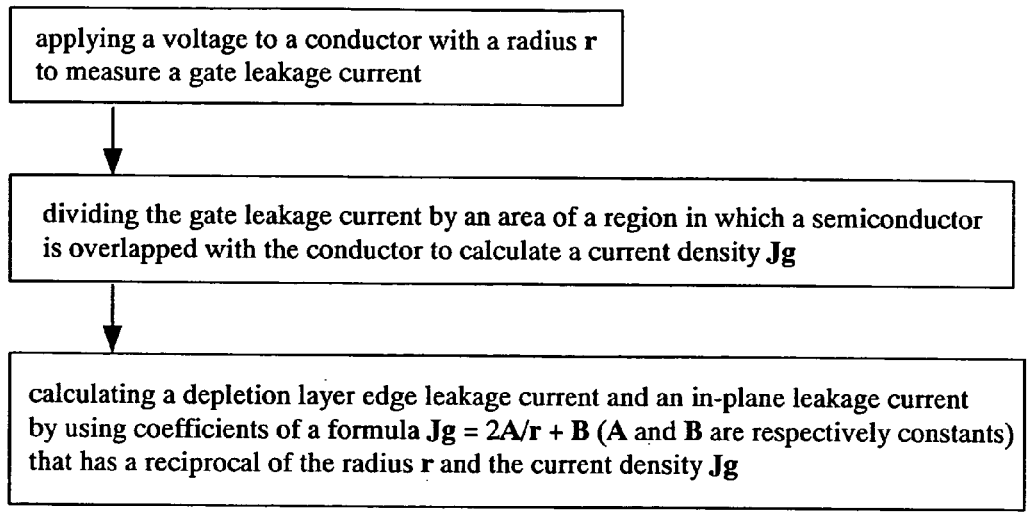
FIGS. 1A and 1B are flowcharts for describing a method for evaluating a semiconductor device according to the present invention, respectively.

A method for evaluating a semiconductor decide according to the present invention, which uses the model described above, includes three steps as shown in FIG. 1A.

In a first step, a voltage is applied to a conductor with a radius r to measure a gate leakage current. Here, a potential difference is provided between a semiconductor and the conductor, a potential of the semiconductor is made equal to a potential (0 V in a lot of cases) of a lower-potential power supply Vss, and a current that flows when the voltage is applied to the conductor (the gate leakage current) is measured.

In a second step, a current density Jg is calculated. More specifically, the gate leakage current is divided by an area of a region in which the semiconductor is overlapped with the conductor to calculate a current density Jg. The area of the region in which the semiconductor is overlapped with the conductor is obtained as an area of the conductor $\pi r^2$.

In a third step, from coefficients of a formula $Jg=2A/r+B$ (A and B are respectively constants) that has a reciprocal of the radius r of the conductor and the current density Jg, a depletion layer edge leakage current and an in-plane leakage current are calcurated. More specifically, a value of a current density of each leakage current is calculated. The depletion layer edge leakage current is proportional to a slope 2A of the formula, and the in-plane leakage current is proportional to an intercept thereof. If necessary, each leakage current can be calculated by using the calculated density of each leakage current and the area of the region in which the semiconductor is overlapped with the conductor are used.

Next, as a semiconductor device that has a MOS structure, a case of a transistor will be described. In view of a structure of a transistor, a gate leakage current is considered to be generated in a plane of a conductor, from an edge portion of a depletion layer, and from an edge portion of a semiconductor, and an in-plane leakage current, a silicon edge leakage current, and a depletion layer edge leakage current are considered to be proportional to an area of the conductor, a channel length, and a channel width, respectively. Since an actually measured gate leakage current is given by the sum of these leakage currents, a gate leakage current $Ig_5$ is expressed by $Ig_5=L \times A+W \times B+L \times W \times C$ (Formula 5), where L represents a channel length of a TFT (a gate length), W represents a channel width (a gate width), and constants of proportion A, B, and C are given by a function of a thickness of a gate insulating film, a dopant density of a channel, and a voltage applied to the conductor. In Formula 5, a first term (L×A), a second term (W×B), and a third term (L×W×C) represent the silicon edge leakage current, the depletion layer edge leakage current, and the in-plane leakage current, respectively. From Formula 5, a current density Jg of the gate leakage current is expressed by Jg=Ig$_5$/(L×W)=A/W+B/L+C (Formula 6).

Figure 1B:
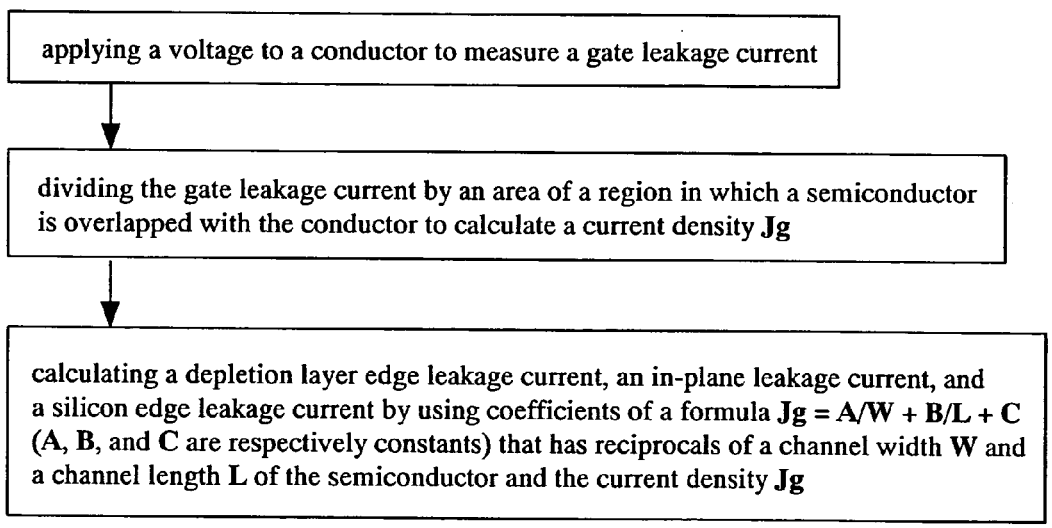

A method for evaluating a semiconductor device according to the present invention, which uses the model described above, includes three steps as shown in FIG. 1B.

In a first step, a voltage is applied to a conductor to measure a gate leakage current. Here, a potential difference is provided between a semiconductor and the conductor, a potential of an impurity region included in the semiconductor is made equal to a potential of a lower-potential power supply, and a current that flows when the voltage is applied to the conductor (the gate leakage current) is measured.

In a second step, a current density Jg is calculated. More specifically, a value of the gate leakage current is divided by an area of a region in which the semiconductor semiconductor is overlapped with the conductor to calculate a current density Jg. In the second step, an area W×L given by multiplying a channel width by a channel length can be used as the area of the region in which the semiconductor is overlapped with the conductor to calculate a current density Jg.

In a third step, coefficients of a formula Jg=A/W+B/L+C (A, B, and C are respectively constants) that has reciprocals of the channel width W and the channel length L of the semiconductor and the current density Jg are used to calculate a depletion layer edge leakage current, an in-plane leakage current, and a silicon edge leakage current. More specifically, a value of a current density of each leakage current is calculated. The silicon edge leakage current is proportional to the constant A of a first term of the formula, the depletion layer edge leakage current is proportional to the constant B of a second term thereof, and the in-plane leakage current is proportional to the constant C of a second term thereof. If necessary, each leakage current can be calculated by using the calculated current density of each leakage current and the area of the region in which the semiconductor is overlapped with the conductor.

The present invention including the methods described above can also be applied to any of an n-channel FET and a p-channel FET manufactured by using an amorphous semiconductor or a polycrystalline semiconductor that is crystallized or deposited on a single-crystal silicon wafer substrate or a glass substrate. In addition, the present invention can be applied to any of a FET that has a single-drain structure, a FET that has an LDD structure, and a FET that has a GOLD structure. As the semiconductor that is used for the FET described above, in addition to simple substances such as silicon (Si) and germanium (Ge), compound semiconductors such as GaAs, InP, SiC, ZnSe, and GaN and alloy semiconductors such as SiGe and Al$_x$GaAs$_{1-x}$ can be used. As the insulator, single-layers film such as a thin film manufactured in accordance with a thermal oxidation treatment, a thin film manufactured in accordance with a manufacturing process using a TEOS (Tetraethyl Orthosilicate) gas, a silicon oxynitride film, and a silicon nitride film, and a multilayer film of a combination of the single-layer films can be used. As the conductor (gate electrode), in addition to a polycrystalline semiconductor (p-Si), a single-layer film including tungsten (W), aluminum (Al), titanium (Ti), or tantalum (Ta) and a multilayer film of a combination of the single-layer films can be used.

Besides, the n-channel FET corresponds to a FET that has source and drain regions and an LDD region into which an impurity that acts as a donor, such as phosphorus (P), arsenide, or antimony (Sb), is injected, and has a channel region into which an impurity that acts as an acceptor, such as boron (B), tin (Sn), or aluminum (Al), is injected. The p-channel FET corresponds to a FET that has source and drain regions and an LDD region into which an impurity that acts as an acceptor, such as such as boron, tin, or aluminum, is injected, and has a channel region into which an impurity that acts as a donor, such as phosphorus, arsenide, or antimony, is injected.

Embodiment 1

A MOS capacitor is taken as an example of a semiconductor device to describe below a method for separating a gate leakage current of the MOS capacitor by leakage path.

Figure 2A:
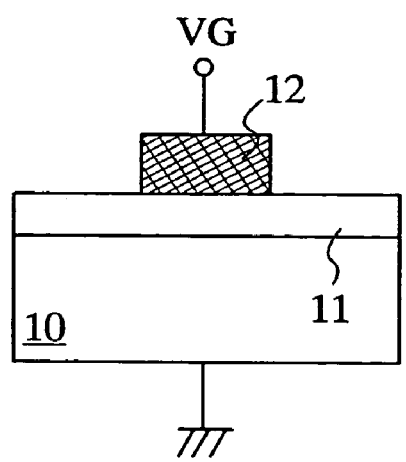
FIGS. 2A and 2B are a sectional view and a top view of a MOS capacitor, respectively.
Figure 2B:
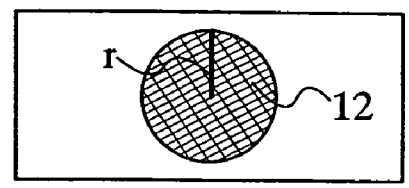

First of all, a method for manufacturing a MOS capacitor to be used in the following evaluation will be simply described with reference to a sectional view of FIG. 2A and a top view of FIG. 2B.

First, on a p-type silicon wafer substrate 10 (a resistivity from 2 to 7 Ω), a silicon oxynitride film is formed by CVD as an insulating film 11. This insulating film 11 is formed to have each of different thicknesses of 20 nm, 30 nm, 40 nm, 50 nm, and 80 nm. Next, for a gate electrode 12, tantalum nitride (TaN) and tungsten (W) are deposited by sputtering to be a thickness of 30 nm and a thickness of 370 nm, respectively. Subsequently, in order for a radius r to be 0.125 mm, 0.25 mm, and 0.5 mm, resist masks are used to perform patterning and dry etching. Then, the gate electrode 12 having two layers respectively including tantalum nitride and tungsten is formed. On a rear surface of the silicon wafer substrate 10, aluminum silicon (AlSi) is deposited by sputtering to be a thickness of 400 nm. After that, a heat treatment at 350° C. is conducted for hydrogen annealing. The MOS capacitor manufactured in accordance with the processes described above is used to measure a gate leakage current, where a bottom of the silicon wafer substrate 10 is grounded, and a voltage from 0 to 50 V is applied to the gate electrode 12.

Figure 3A:
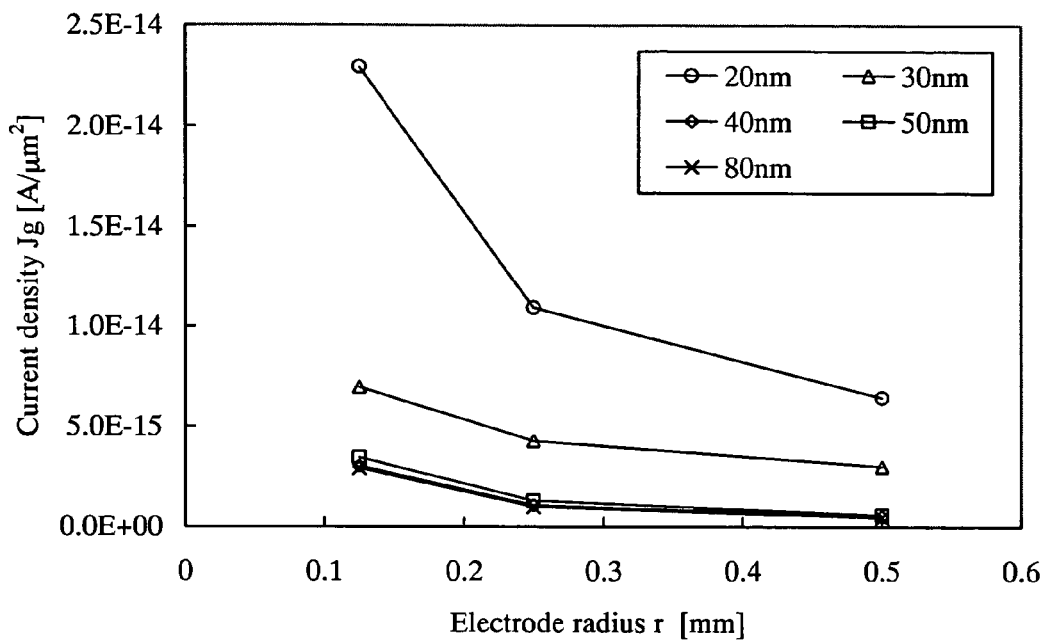
FIGS. 3A and 3B are graphs showing the dependence of a density of a gate leakage current of the MOS capacitor on an electrode radius and on a reciprocal of the electrode radius, respectively.

FIG. 3A shows the dependence of a current density of a gate leakage current on an electrode radius, where the gate leakage current is generated when an electric field of 4 MV/cm is applied to the insulating film, a horizontal axis indicates the electrode radius r (mm), and a vertical axis indicates a current density Jg (A/μm$^2$) in a logarithmic scale. More specifically, as for the logarithmic scale, "0.0E+00", "5.0E−15", "1.0E−14", "1.5E−14", "2.0E−14", and "2.5E−14", indicate "0", "5.0×10$^{−15}$", "1.0×10$^{−14}$", "1.5×10$^{−14}$", "2×10$^{−14}$", and "2.5×10$^{−14}$", respective same in subsequent graphs.

Figure 3B:
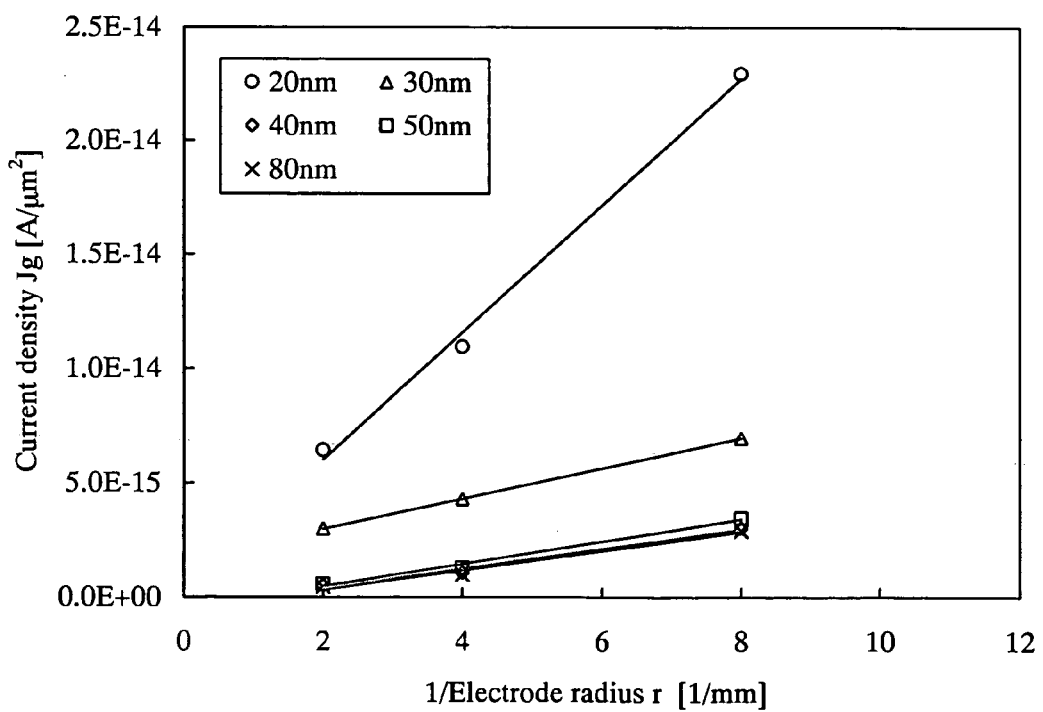

Further, in FIG. 3A, a line given by connecting circular marks (○) shows a result in the case of the insulating film 20 nm thick, a line given by connecting triangle marks (Δ) shows a result in the case of the insulating film 30 nm thick, a line given by connecting rhombic marks (◇) shows a result in the case of the insulating film 40 nm thick, a line given by connecting rectangular marks (□) shows a result in the case of the insulating film 50 nm thick, and a line given by connecting cross marks (x) shows a result in the case of the insulating film 80 nm thick, which is the same in FIG. 3B.

From FIG. 3A, it turns out that the current density is increased independently of the film thickness of the insulating film as the electrode radius becomes large. If the gate leakage current depends on mainly an in-plane leakage current, the current density does not depend on the electrode radius. Accordingly, it turns out the gate leakage current includes a leakage current from a region other than the plane of the electrode.

FIG. 3B shows the dependence of the current density of the gate leakage current on a reciprocal of the electrode radius, where the gate leakage current is generated when the electric field of 4 MV/cm is applied to the insulating film, a horizontal axis indicates a reciprocal of the electrode radius 1/r ($mm^{-1}$), and a vertical axis indicates the current density Jg (A/$\mu m^2$) in the logarithmic scale.

From FIG. 3B, it turns out that the current density is directly proportional to the reciprocal of the electrode radius independently of the film thickness of the insulating film. Here, from the aforementioned Formula 4, it turns out that a current density is directly proportional to a reciprocal of an electrode radius when a gate leakage current is the sum of an in-plane leakage current and a depletion layer edge leakage current. Accordingly, from FIG. 3B, it turns out that the gate leakage current is the sum of an in-plane leakage current and a depletion layer edge leakage current.

Figure 4:
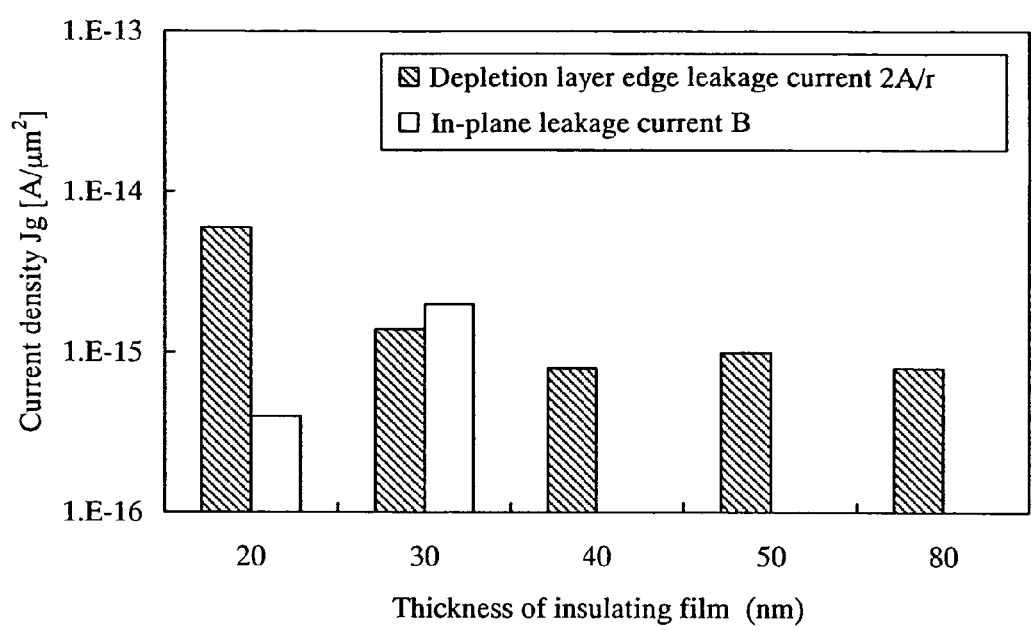
FIG. 4 is a graph showing a dependence of a gate leakage current of the MOS capacitor on a thickness of an insulating film.

Then, FIG. 4 shows an in-plane leakage current and a depletion layer edge leakage current calculated on the basis of a slope and an intercept of a line in FIG. 3B, where the electrode radius is 0.5 mm, a horizontal axis indicates the film thickness of the insulating film (nm), and a vertical axis indicates a current density Jg (A/$\mu m^2$) in the logarithmic scale.

From FIG. 4, it turns out that the gate leakage current depends on mainly the depletion layer edge leakage current when the film thickness of the insulating film is 40 nm or more and the in-plane leakage current is generated in addition to the depletion layer edge leakage current the when the film thickness of the insulating film is 40 nm or less.

The gate leakage current and the ratio of the in-plane leakage current in the current value to the depletion layer edge leakage current in the current value vary according to a voltage to be applied to the gate electrode.

Embodiment 2

A TFT is taken as an example of a semiconductor device to describe below a method for separating a gate leakage current of the TFT by leakage path.

Figure 5A:
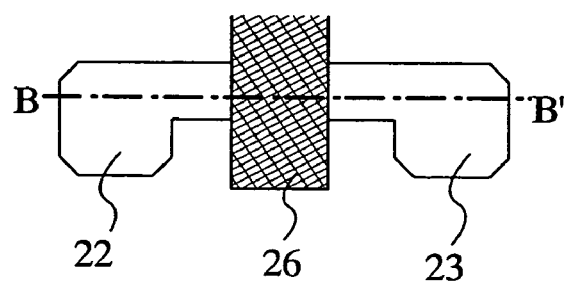
FIGS. 5A and 5B are a sectional view and a top view of a transistor.
Figure 5B:
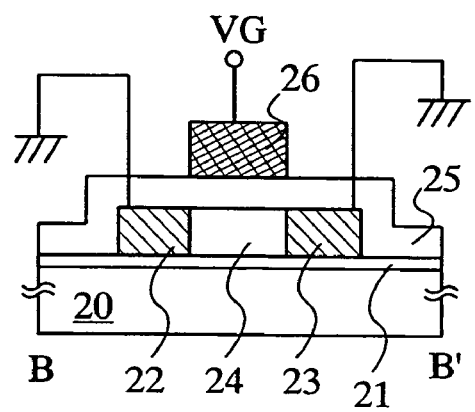

First of all, a method for manufacturing a TFT to be used in the following evaluation will be simply described with reference to a sectional view of FIG. 5A and a top view of FIG. 5B.

First, on a glass substrate 20, a silicon oxide film is formed to be a thickness of 150 nm as an insulating film 21, and then, on the insulating film 21, an amorphous semiconductor (a-Si/amorphous silicon) film is formed to be a thickness of 50 nm. Next, a catalyst (preferably, nickel) is added to the amorphous semiconductor film, and a heat treatment or laser irradiation is carried out to form a crystalline semiconductor film. Subsequently, as channel doping, a doping process is conducted to dope the crystalline semiconductor film with phosphorous at a concentration of $4\times10^{13}$ atoms/$cm^2$ in the case of forming an n-channel TFT while a doping process is conducted to dope the crystalline semiconductor film with boron at a concentration of $2\times10^{13}$ atoms/$cm^2$ in the case of forming an p-channel TFT. Then, after patterning of the crystalline semiconductor film is performed, an insulating film (a gate insulating film) 25 is formed. This insulating film 25 is formed in several to have each of different thicknesses of 20 nm, 30 nm, 40 nm, 50 nm, and 80 nm.

Next, tantalum nitride and tungsten are deposited by sputtering to be a thickness of 30 nm and a thickness of 370 nm, respectively, and after that, resist masks are used to perform patterning and dry etching. Then, a gate electrode 26 having two layers respectively including tantalum nitride and tungsten is formed. Subsequently, in order to form source and drain regions (correspond impurity regions 22 and 23 in a sectional structure of FIG. 5B) and a channel formation region 24, according to the film thickness of the insulating film 25, an acceleration voltage is appropriately changed so that a doping process is conducted to dope the crystalline semiconductor film with phosphorus at a concentration from $3\times10^{15}$ to $1\times10^{16}$ atoms/$cm^2$ in the case of forming an n-channel TFT while an acceleration voltage is appropriately changed so that a doping process is conducted to dope the crystalline semiconductor film with boron at a concentration of $1\times10^{16}$ atoms/$cm^2$ in the case of forming an p-channel TFT. After that, a heat treatment at 550° C. for 4 hours is conducted in order to activate the dopants.

The transistor manufactured in accordance with the processes described above is used to measure a gate leakage current, where the source region and the drain region are grounded, and a voltage from 0 to 50 V is applied to the gate electrode in the case of an n-channel TFT while a voltage from 0 to −50 V is applied to the gate electrode in the case of an p-channel TFT.

Figure 6A:
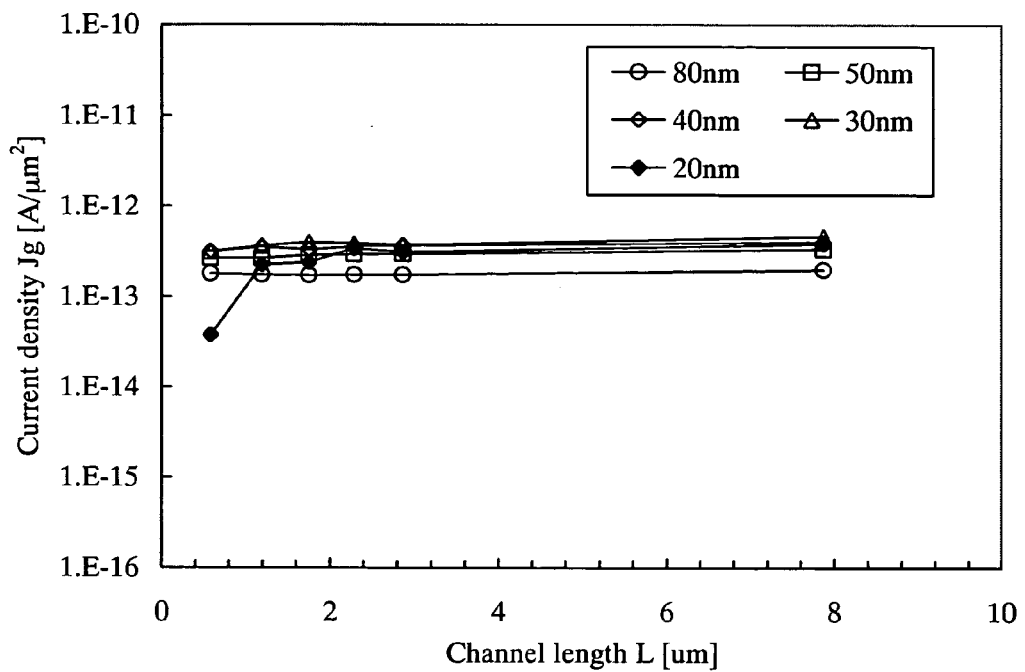
FIGS. 6A and 6B are graphs showing the dependence of a density of a gate leakage current of an n-channel transistor on a channel length and on a channel width, respectively.

FIG. 6A shows the dependence of a density of a gate leakage current on a channel length, where the gate leakage current is generated when an electric field of 6 MV/cm is applied to a gate insulating film of an n-channel transistor that has a channel width (W) of 8 μm, a horizontal axis indicates a channel length L (μm), and a vertical axis indicates a current density Jg (A/$\mu m^2$) in the logarithmic scale.

Further, a line given by connecting black rhombic marks (◆) shows a result in the case of the insulating film 20 nm thick, a line given by connecting triangle marks (Δ) shows a result in the case of the insulating film 30 nm thick, a line given by connecting white rhombic marks (◇) shows a result in the case of the insulating film 40 nm thick, a line given by connecting rectangular marks (□) shows a result in the case of the insulating film 50 nm thick, and a line given by connecting circular marks (○) shows a result in the case of the insulating film 80 nm thick, which is the same in FIGS. 6B, 7A, 7B, 8A, 8B, 10A, and 10B.

From FIG. 6A, it turns out that the dependence of the current density on the channel width is low. In addition, it also turns out that the tendency does not depend on the thickness of the insulating film.

Figure 6B:
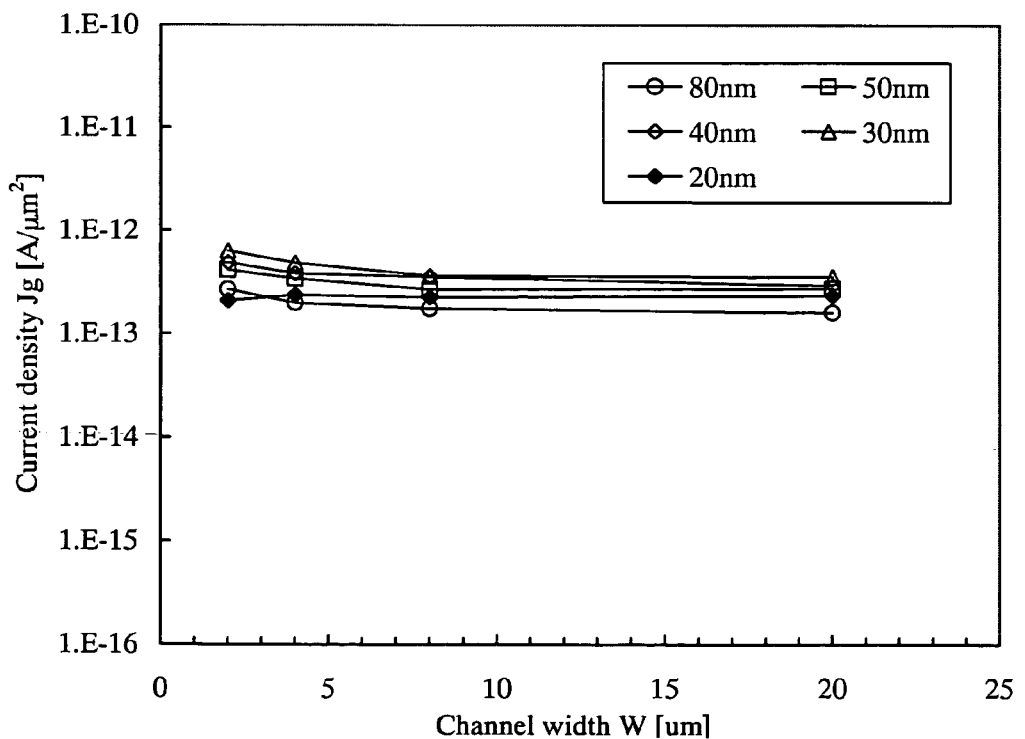

FIG. 6B shows a channel width dependency of a current density of a gate leakage current, where the gate leakage current is generated when an electric field of 6 MV/cm is applied to a gate insulating film of an n-channel transistor that has a channel length (L) of 1.5 μm, a horizontal axis indicates a channel width W (μm), and a vertical axis indicates a current density Jg (A/$\mu m^2$) in the logarithmic scale.

From FIG. 6B, it turns out that the current density is decreased as the channel width becomes larger. This tendency indicates that a silicon edge leakage current is included in the gate leakage current.

From FIGS. 6A and 6B, it turns out that an in-plane leakage current and a silicon edge leakage current are generated as a gate leakage current of an n-channel transistor.

Figure 7A:
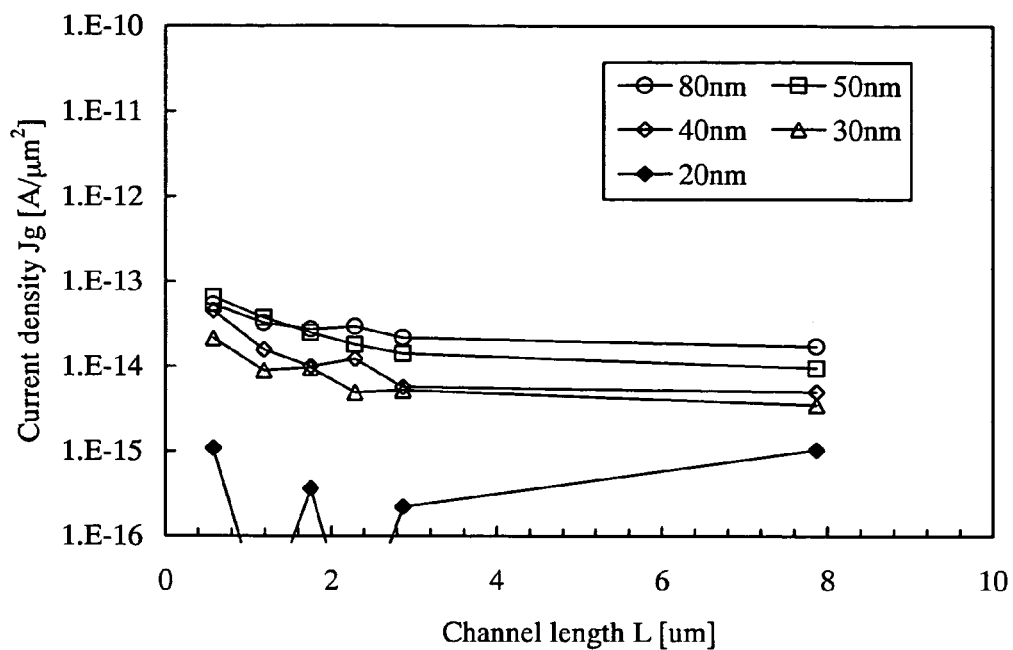
FIGS. 7A and 7B are graphs showing the dependence of a density of a gate leakage current of an p-channel transistor on a channel length and on a channel width, respectively.

FIG. 7A shows the dependence of a current density of a gate leakage current on a channel length, where the gate leakage current is generated when an electric field of 6 MV/cm is applied to a gate insulating film of an p-channel transistor that has a channel width (W) of 8 μm, a horizontal axis indicates a channel length L (μm), and a vertical axis indicates a current density Jg (A/μm$^2$) in the logarithmic scale.

From FIG. 7A, it turns out that the current density tends to be decreased as the channel length becomes larger. If the gate leakage current only includes an in-plane leakage current and a silicon edge leakage current, the current density does not depend on the channel length. Accordingly, this result indicates that another leakage current, for example, a depletion layer edge leakage current, is also included in the gate leakage current.

Figure 7B:
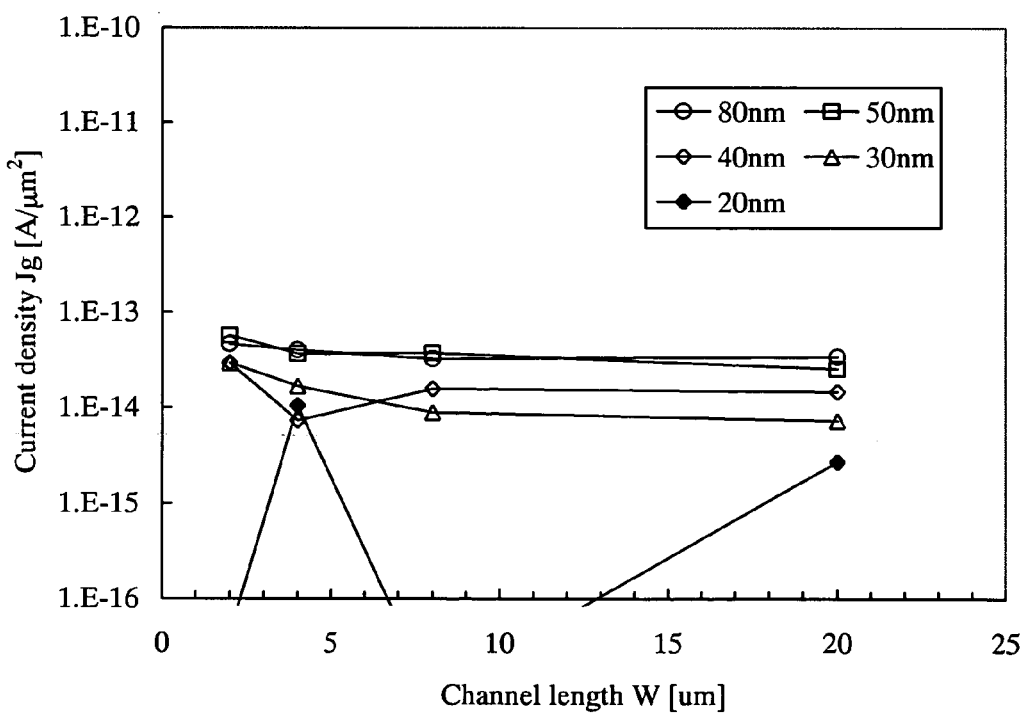

FIG. 7B shows the dependence of a density of a gate leakage current on a channel width, where the gate leakage current is generated when an electric field of 6 MV/cm is applied to a gate insulating film of an p-channel transistor that has a channel length (L) of 1.5 μm, a horizontal axis indicates a channel width W (μm), and a vertical axis indicates a current density Jg (A/μm$^2$) in the logarithmic scale.

From FIG. 7B, as the n-channel transistor, it turns out that the current density is decreased as the channel width becomes increased. This tendency indicates that a silicon edge leakage current is included in the gate leakage current.

From FIGS. 7A and 7B, a gate leakage current of a p-channel transistor is believed to include a silicon edge leakage current and another leakage current such as a depletion layer edge leakage current.

Next, in order to investigate a cause of the gate leakage current, it is confirmed whether the dependence a density on a reciprocal of a channel length and on a reciprocal of a channel width can be subjected to fitting into Formula 6.

Figure 8A:
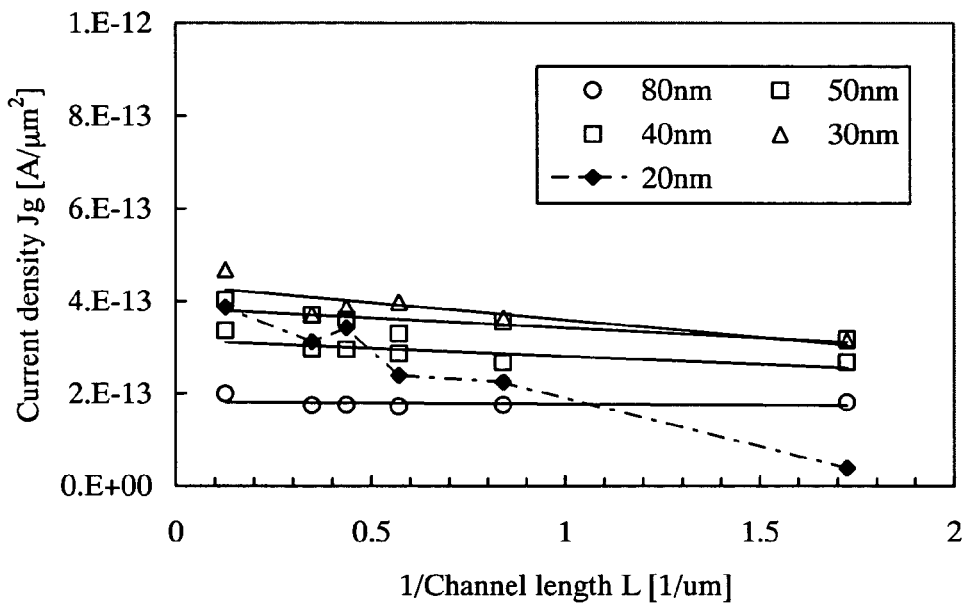
FIGS. 8A and 8B are graphs showing the dependence of the current density of the gate leakage current of the n-channel transistor on a reciprocal of the channel length and on a reciprocal of the channel width, respectively.

FIG. 8A shows the dependence of the density of the gate leakage current of the n-channel transistor on a reciprocal of the channel length.

From FIG. 8A, it turns out that the current density hardly depends on the reciprocal of the channel length. This result indicates that a leakage current from an edge of a depletion layer is quite small as can be expected from Formula 6.

Figure 8B:
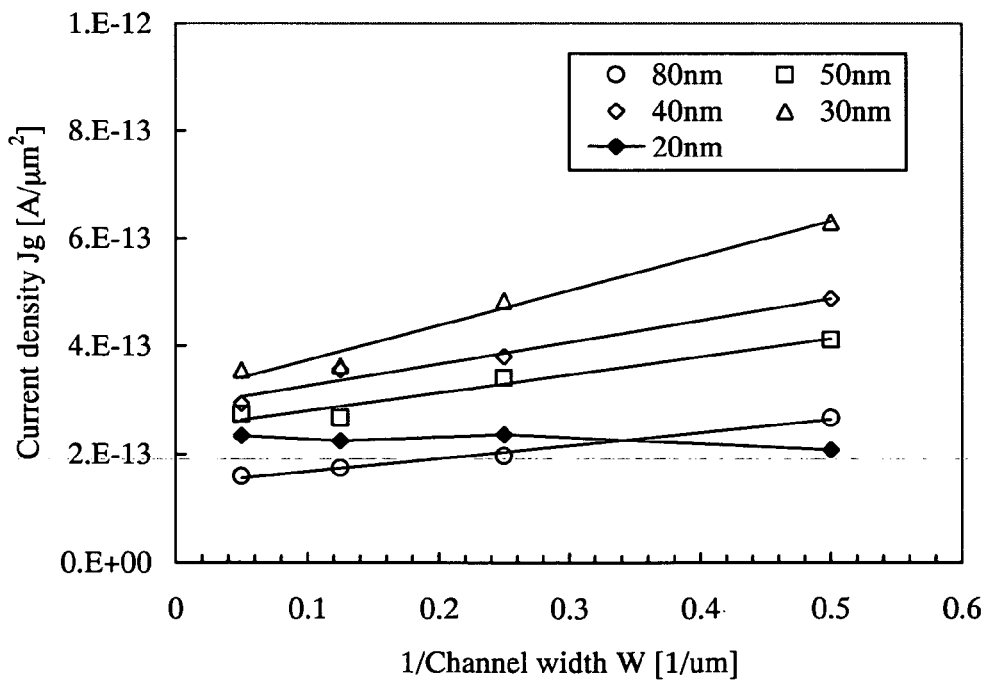

FIG. 8B shows the dependence of the density of the gate leakage current of the n-channel transistor on a reciprocal of the channel width.

In FIG. 8B, in the case of the gate insulating film 20 nm thick, a noise of measuring the gate leakage current is large, which shows a limit to the measurement. Except for the case of the gate insulating film 20 nm thick, it turns out that the current density is directly proportional to the reciprocal of the channel width. Accordingly, this result indicates that a silicon edge leakage current is included in the gate leakage current. In addition, since an intercept of a line in accordance with the fitting represents an in-plane leakage current according to Formula 6, which is not zero, the gate leakage current also includes an in-plane leakage current.

Figure 9:
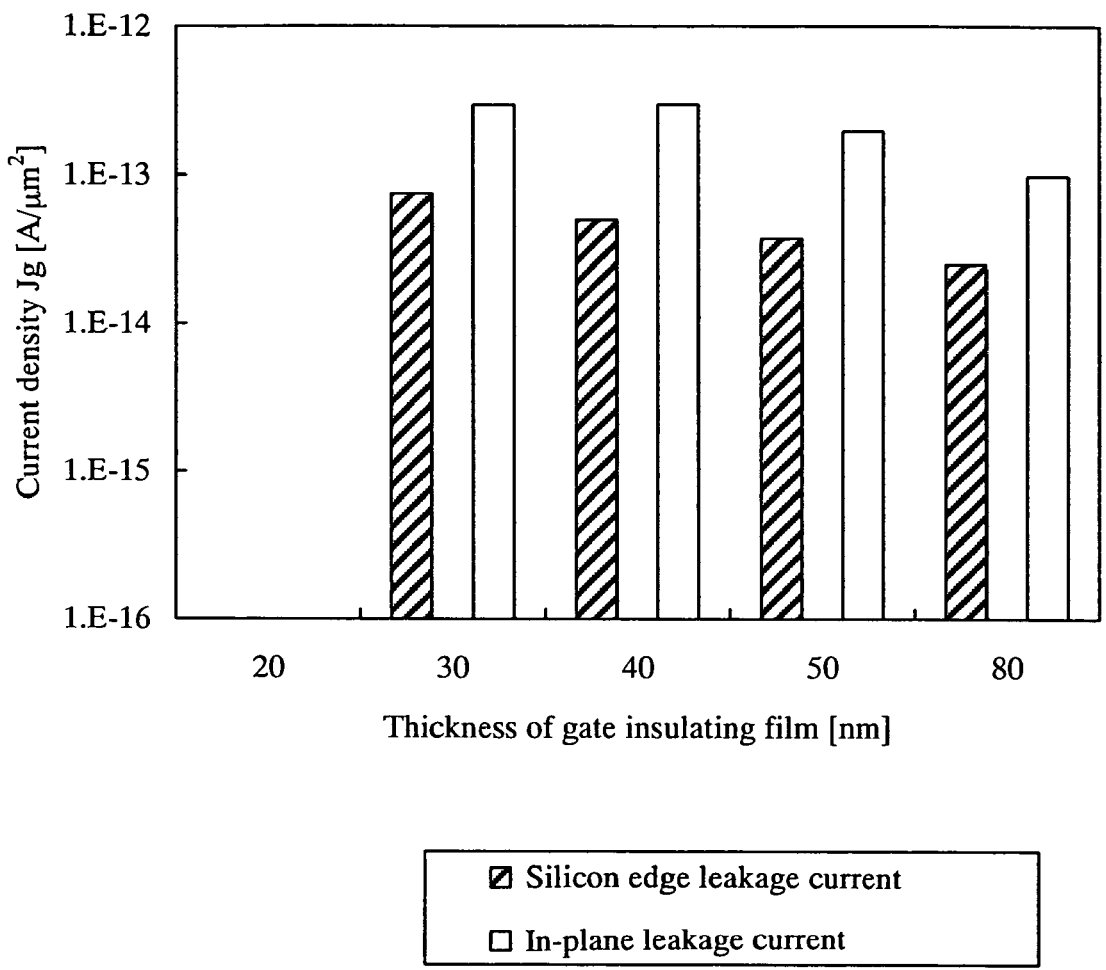
FIG. 9 is a graph showing a graph showing the dependence of the gate leakage current of the n-channel transistor on a film thickness of an insulating film.

Next, a slope and an intercept are obtained from a line in accordance with fitting in FIG. 8A or 8B, and Formula 6 is used to obtain a correlation between the thickness of the gate insulating film and a current density in the case of the channel length 8 μm thick and the channel width 8 μm. FIG. 9 shows results thereof. The density of the depletion layer edge leakage current is less than $1 \times 10^{-16}$ A/μm$^2$ and much smaller than that of the silicon edge leakage current and that of the in-plane leakage current, and therefore, the density of the depletion layer edge leakage current is not shown in FIG. 9.

From FIG. 9, it turns out the gate leakage current includes mainly an in-plane leakage current and a silicon edge leakage current, which tend to be increased as the thickness of the gate insulating film becomes smaller.

Next, also as for the p-channel transistor, dependencies of the current density on a reciprocal of the channel length and on a reciprocal of the channel width are searched in the same way.

Figure 10A:
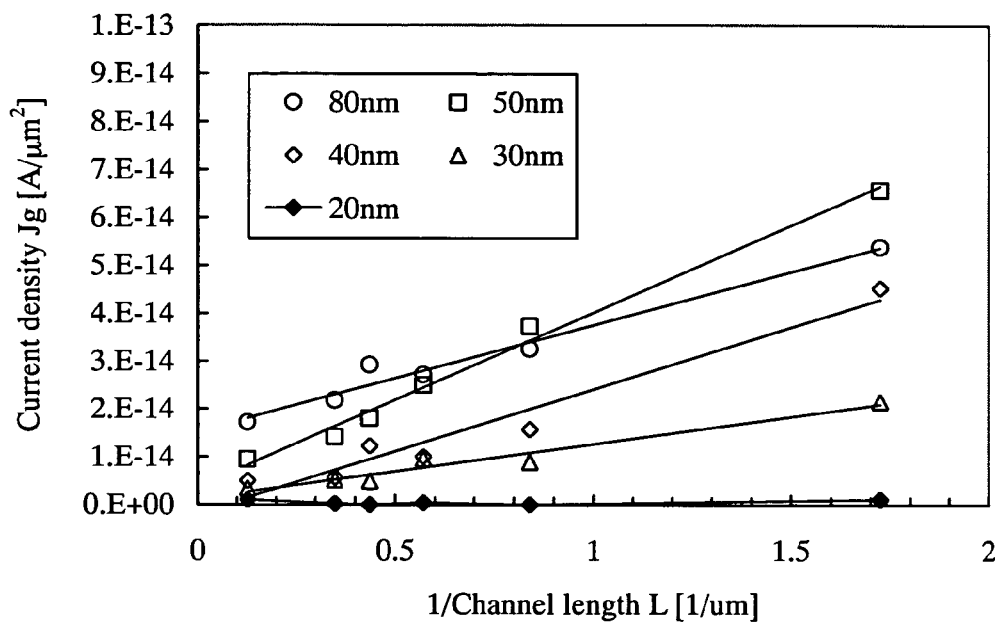
FIGS. 10A and 10B are graphs showing the dependence of the current density of the gate leakage current of the p-channel transistor on a reciprocal of the channel length and on a reciprocal of the channel width, respectively.

FIG. 10A shows the dependence of the current density of the gate leakage current of the p-channel transistor on a reciprocal of the channel length. From FIG. 10A, it turns out that the current density is directly proportional to the reciprocal of the channel length.

Figure 10B:
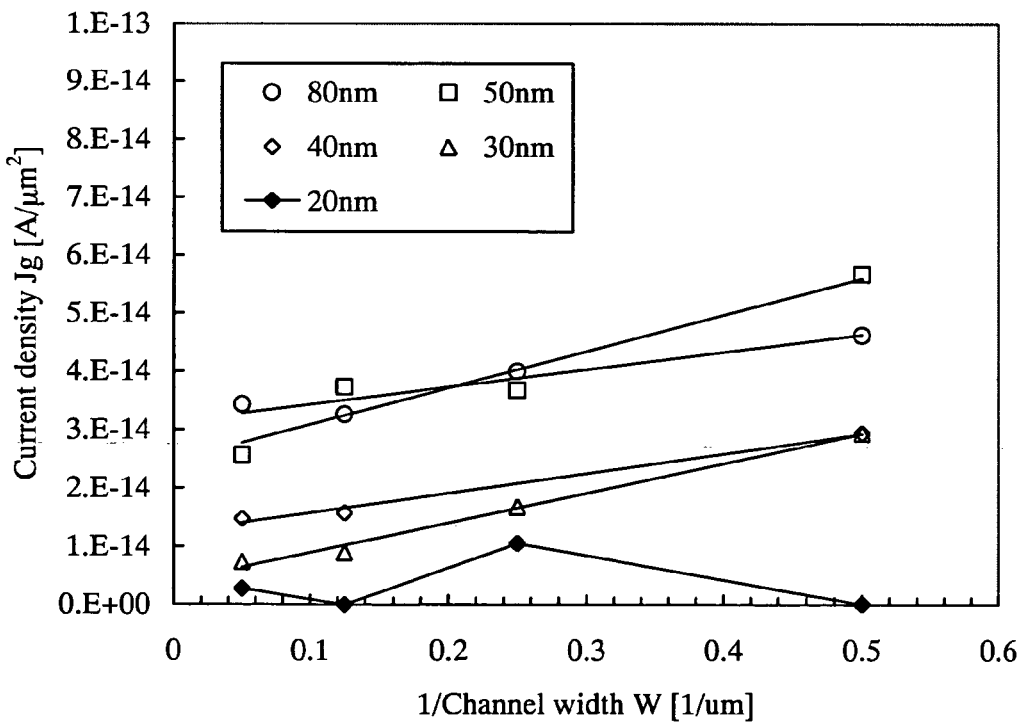

FIG. 10B shows the dependence of the density of the gate leakage current of the p-channel transistor on a reciprocal of the channel width. From FIG. 10B, it turns out that the current density is directly proportional to the reciprocal of the channel width.

These results indicate that the gate leakage current includes a silicon edge leakage current and a depletion layer edge leakage current.

Figure 11:
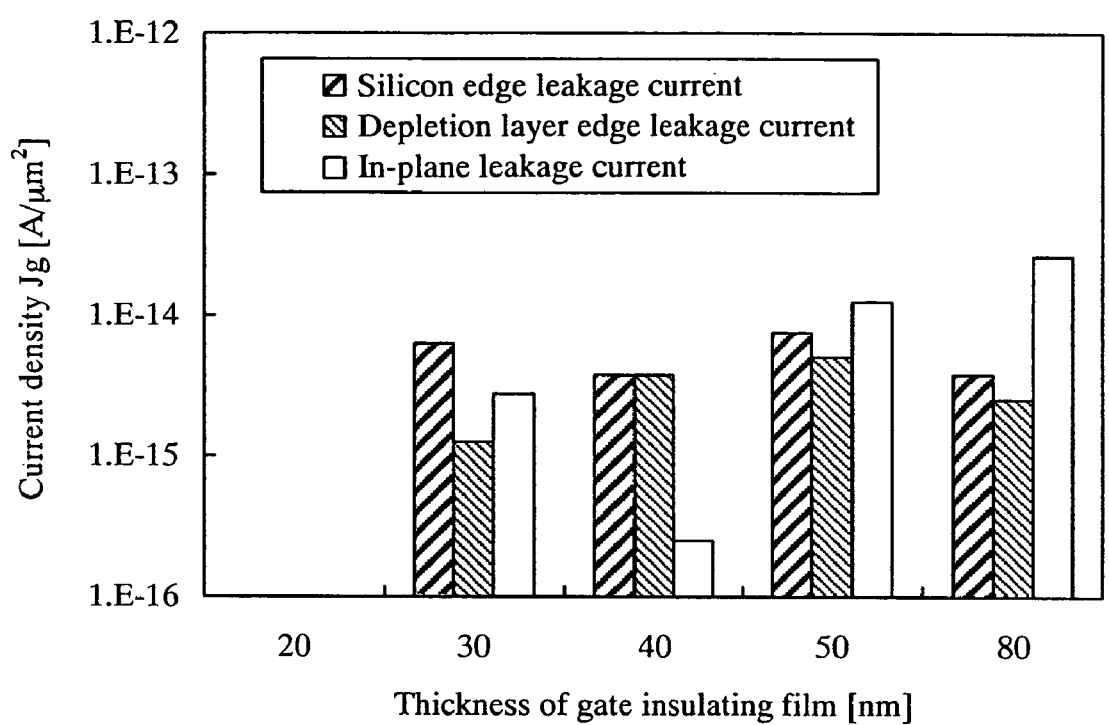
FIG. 11 is a graph showing a graph showing a graph showing the dependence of the gate leakage current of the p-channel transistor on a film thickness of an insulating film.
Figure 12A:
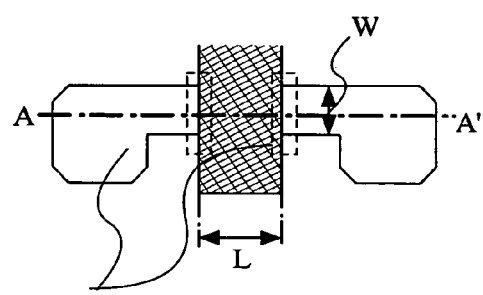
FIGS. 12A to 12D are diagrams describing a silicon edge leakage current and a depletion layer edge leakage current.
Figure 12B:
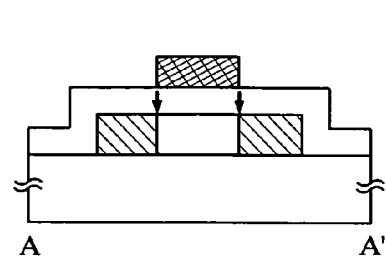
Figure 12C:
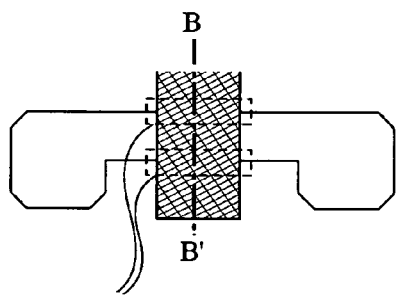
Figure 12D:
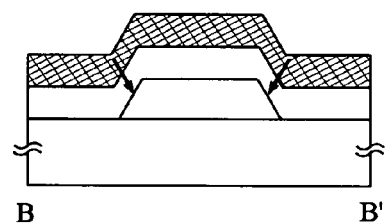

Next, a slope and an intercept are obtained from a line in accordance with the fitting in FIG. 10A or 10B, and Formula 6 is used to obtain a correlation between the thickness of the gate insulating film and a current density in the case of the channel length 8 μm thick and the channel width 8 μm. FIG. 11 shows results thereof.

From FIG. 11, it turns out the gate leakage current includes an in-plane leakage current, a silicon edge leakage current, and a depletion layer edge leakage current.

Comparing FIG. 9 with FIG. 11, it turns out that the in-plane leakage current and the silicon edge leakage current of the n-channel transistor are both larger as compared to the p-channel transistor. As a reason for this tendency, the following can be considered.

Since a plus voltage is applied on the gate electrode in the case of the n-channel transistor, an electron is induced to an interface between the gate insulating film and silicon and injected into the insulating film. On the contrary, since a minus voltage is applied in the gate electrode in the case of the p-channel transistor, a hole is induced to an interface between the gate insulating film and silicon and injected into the insulating film. Since a barrier between the silicon and the insulating film against the hole is higher than that against the electron, the electron is more likely to be injected provided that an absolute value of a gate voltage applied to the n-channel transistor is equal to an absolute value of a gate voltage applied to the n-channel transistor. Accordingly, it is considered that the in-plane leakage current is dominant in the case of the n-channel transistor since the electron is more likely to be injected into the insulating film. Also, it is considered that the in-plane leakage current is small, and that the leakage currents from the edge portions, which are likely to leakage, are large in the case of the p-channel transistor since the hole is not likely to be injected into the insulating film.

As described above, the present invention makes it possible to separate a gate leakage current by leakage path quantitatively, and makes it possible to feed back appropriately to a process to enable a gate insulating film to be improved qualitatively.

Although the present invention has been fully described by way of example with reference to the accompanying drawings, it is to be understood that various changes and modifications will be apparent to those skilled in the art. Therefore, unless such changes and modifications depart from the scope of the present invention hereinafter defined, they should be construed as being included therein.

What is claimed is:

1. A method for evaluating a semiconductor device comprising a laminate comprising a semiconductor, an insulator, and a conductor, comprising:
    applying a voltage to the conductor with a radius r to measure a gate leakage current;
    dividing the gate leakage current by an area of a region in which the semiconductor is overlapped with the conductor to calculate a current density Jg;
    using coefficients of a formula Jg=2A/r+B (A and B are respectively constants) to calculate a depletion layer edge leakage current and an in-plane leakage current; and
    calculating a depletion layer edge leakage current and an in-plane leakage current by using coefficients of a formula Jg=2A/r+B (A and B are respectively constants).

2. A method for evaluating a semiconductor device comprising a laminate comprising a semiconductor, an insulator, and a conductor, comprising:
    applying a voltage to the conductor to measure a gate leakage current;
    dividing the gate leakage current by an area of a region in which the semiconductor is overlapped with the conductor to calculate a current density Jg; and
    calculating a depletion layer edge leakage current, an in-plane leakage current, and a silicon edge leakage current by using coefficients of a formula Jg=A/W+B/L+C (A, B, and C are respectively constants).

3. A method for evaluating a semiconductor device comprising a laminate comprising a semiconductor, an insulator, and a conductor, comprising:
    making a potential of the semiconductor equal to a potential of a lower-potential power supply and applying a voltage to the conductor with a radius r to measure a gate leakage current;
    dividing the gate leakage current by an area $\pi r^2$ of the conductor to calculate a current density Jg;
    using coefficients of a formula Jg=2A/r+B (A and B are respectively constants) to calculate a depletion layer edge leakage current and an in-plane leakage current; and
    calculating a depletion layer edge leakage current and an in-plane leakage current by using coefficients of a formula Jg=2A/r+B (A and B are respectively constants).

4. A method for evaluating a semiconductor device comprising a laminate comprising a semiconductor, an insulator, and a conductor, comprising:
    making a potential of an impurity region included in the semiconductor equal to a potential of a lower-potential power supply and applying a voltage to the conductor to measure a gate leakage current;
    dividing the gate leakage current by an area W×L (W is a channel width and L is a channel length) of a region in which the semiconductor is overlapped with the conductor to calculate a current density Jg; and
    calculating a depletion layer edge leakage current, an in-plane leakage current, and a silicon edge leakage current by using coefficients of a formula Jg=A/W+B/L+C (A, B, and C are respectively constants).

* * * * *